United States Patent
Fletcher et al.

(10) Patent No.: US 6,906,649 B2
(45) Date of Patent: Jun. 14, 2005

(54) DITHERING MODULE WITH DIPLEXER

(75) Inventors: Lawrence P. Fletcher, Merrimack, NH (US); Patrick H. Robbins, Andover, MA (US)

(73) Assignee: Micronetics, INC, Nashua, NH (US)

( * ) Notice: Subject to any disclaimer, the term of this patent is extended or adjusted under 35 U.S.C. 154(b) by 44 days.

(21) Appl. No.: 10/635,263

(22) Filed: Aug. 6, 2003

(65) Prior Publication Data

US 2005/0030210 A1 Feb. 10, 2005

(51) Int. Cl.⁷ .............................................. H03M 1/20
(52) U.S. Cl. ..................................................... 341/131
(58) Field of Search .......................................... 341/131

(56) References Cited

U.S. PATENT DOCUMENTS

| | | | |
|---|---|---|---|
| 3,999,129 A | * 12/1976 | Kasson | 341/131 |
| 4,263,617 A | * 4/1981 | Chemin et al. | 348/724 |
| 4,467,472 A | 8/1984 | Wendt | |
| 5,675,335 A | * 10/1997 | Keller | 341/131 |
| 5,959,592 A | 9/1999 | Petruzzelli | |
| 6,268,814 B1 | * 7/2001 | Kolsrud | 341/131 |
| 6,515,542 B1 | * 2/2003 | Wang et al. | 341/131 |

OTHER PUBLICATIONS

MICRONETICS, MDM–70 Dithering Modules, Hudson, NH USA.
MICRONETICS, Mini–Noise Diodes 10 KHz to 3 GHz, Hudson, NH USA.
MICRONETICS, Noise Diodes 10Hz to 110GHz, Hudson, NH USA.
Analog Devices, AN–410 Application Note, pp. 1–8, Norwood, MA USA.
Linear Technology, LT1818/LT1819 400MHz, 2500V/μs, 9mA Single/Dual Operational Amplifiers, pp. 1–16, Milpitas, CA USA.
Linear Technology, LT1129/LT1129–3.3/LT1129–5 Micropower Low Dropout Regulators with Shutdown, pp. 1–16, Milpitas, CA USA.
Linear Technology, LTC1566–1 Low Noise 2.3MHz Continous Time Lowpass Filter, pp. 1–8, Milpitas, CA USA.
Linear Technology, LT1797 10MHz, Rail–to–Rail Input and Output Op Amp in SOT–23, pp. 1–12, Milpitas, CA USA.

* cited by examiner

Primary Examiner—Howard L. Williams
(74) Attorney, Agent, or Firm—Maine & Asmus

(57) ABSTRACT

Dithering techniques that efficiently combine a non-correlated noise signal with a desired signal are disclosed. Insertion loss in the noise path is relatively low due to combining means employed. In one embodiment, a self-contained dithering module includes a diplexer (or equivalent device) that provides an insertion loss associated with the noise signal of 3 dB or less. The signal+noise output can be used in noise-based application such as a data conversion process.

25 Claims, 3 Drawing Sheets

DITHERING MODULE WITH DIPLEXER

FIELD OF THE INVENTION

The invention relates to dithering, and more particularly, to a self-contained dithering module that employs a diplexer to inject a non-correlated noise signal into a desired signal to randomize spurs.

BACKGROUND OF THE INVENTION

High performance analog-to-digital (A/D) converters are now widely used in modern communication systems. Many wireless receivers which handle a substantial dynamic range of signal amplitudes of a high data rate signal require the A/D converter to be operating at peak performance. One particular problem in such high performance A/D converters is differential non-linearity (DNL) errors, commonly referred to as spurs. DNL error is generally defined as the difference between an actual step width of an A/D converter and the ideal value of 1 least significant bit.

High performance A/D converters use multi-stage conversion. Although DNL errors occur in any A/D converter following a given probability density function (PDF), the effect is multiplied in multi-stage converters because the DNL pattern is repeated many times over. As such, DNL errors can dramatically impact the performance of a multi-stage A/D conversion process. Preventing the generation of DNL errors in the A/D conversion process, therefore, becomes paramount. In particular, one of the most important figures of merit for a digital receiver is spurious free dynamic range (SFDR). A receiver with excellent SFDR is able to receive at maximum data rate even when receive signals are at the low amplitude range of the receiver. DNL errors effectively decrease a receiver's SFDR rating.

A well-known technique called dithering is often required to maximize spurious free dynamic range. Dithering is the process of adding a non-correlated signal, such as pseudo random or broadband noise, to a desired analog signal prior to the analog input gate of the A/D converter. Although the injected dither does not eliminate the errors, it randomizes the DNL errors over the entire digitization process, thereby eliminating the concentration of DNL errors at a small number of codes. As a result, spurs are reduced with a negligible increase in the noise floor.

A common technique for generating the non-correlated signal is to use a thermal noise source which is uncorrelated to everything in the application universe. Adding noise that is not co-spectral with the desired signal is important, as otherwise, the benefits of the dithering are at least partially lost. In order to ensure this for most applications, the noise that is added can be low-pass filtered so as not to encroach on the frequency band of the desired signal.

Another issue that arises when combining the non-correlated noise signal with the desired signal is related to input loss caused by the circuit which adds the noise to it. In particular, the amount of power that the non-correlated signal requires (as typically supplied by a noise source) must be high enough to achieve the desired dithering effect. Conventionally, a directional coupler is utilized to add the non-correlated signal to the desired signal.

The directional coupler allows the desired signal to be combined with the non-correlated noise signal with a small loss in the signal path, and a substantial loss in the noise path. A 20 dB coupler, for instance, will result in a signal loss of 0.5 dB but a noise path loss of 20 dB. The noise source circuit must therefore overcome this loss by supplying an additional 20 dB of amplification. This additional 20 dB is not a trivial amount of power, and serves no useful purpose other than dissipating across the noise path of the directional coupler.

What is needed, therefore, are dithering techniques that efficiently combine a non-correlated noise signal with the desired signal to achieve high performance A/D conversion. In a more general sense, there is a need for a self-contained dithering module that generates the desired amplitude of noise as well as the appropriate noise signal roll-off for optimal results.

BRIEF SUMMARY OF THE INVENTION

One embodiment of the present invention provides a method for dithering a desired signal having a frequency band. The method includes generating a noise signal, amplifying the noise signal, and combining the amplified noise signal with the desired signal to produce a signal+noise signal, wherein both the desired signal and the noise signal experience insertion loss of 3 dB or less.

In one particular embodiment, amplifying the noise signal further includes filtering the noise signal, so as to prevent the noise signal from adversely affecting the frequency band of the desired signal. Filtering the noise signal may include low-pass filtering that noise signal depending on the location of the noise band in relation to the desired signal frequency band. Other embodiments may employ high-pass or band-pass filtering. Note that the amplifying and filtering can be performed simultaneously (e.g., active filter with gain), separately (e.g., amplify then filter), or a combination thereof (e.g., amplify then active filter with gain).

Combining the amplified noise signal with the desired signal may be carried out by diplexing the filtered noise signal with the desired signal to produce a signal+noise signal. In one particular embodiment, diplexing the filtered noise signal with the desired signal to produce a signal+noise signal includes providing approximately zero or otherwise low insertion loss associated with the desired signal and the noise signal. Diplexer parameters (e.g., low-pass filter corner frequency and roll-off rate, and high-pass filter corner frequency) can be set to accommodate the particular application for which the method is operating. Combining the amplified noise signal with the desired signal may further include combining a second noise signal, and the desired signal+noise signal includes the second noise signal.

The method may further include providing the signal+noise signal to a noise-based application, such as a data conversion process (e.g., A/D). The noise signal can be, for example, thermal noise. The insertion loss experienced by the noise signal can range, for example, from 0 to 3 dB. In one particular embodiment, the insertion loss experienced by the noise signal is less than 1 dB. Generally stated, the insertion loss will vary from one design to the next, and should not prohibit the noise-based application in which the method is being used.

Another embodiment of the present invention provides a self-contained dithering module. This device includes a noise source adapted to generate a noise signal, an amplification stage adapted to amplify the noise signal, and a diplexer adapted to diplex the filtered noise signal with the desired signal to produce a signal+noise signal. This signal can be used, for example, in a data conversion process.

The amplification stage may further be adapted to filter the noise signal, so as to prevent that noise signal from adversely affecting the frequency band of the desired signal.

The amplification stage may further include one or more active low-pass filters adapted to filter the noise signal. In one particular embodiment, the diplexer provides an insertion loss experienced by the noise signal that is 1 dB or less. The device can be contained, for example, in a package having a power input, a desired signal input, a signal+noise output, and a common. Suitable interface techniques (e.g., pick-and-place, solder re-flow, wire-bonding, SMA or BNC fittings) can be employed to facilitate coupling the device to other circuitry.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Embodiments of the present invention provide a dithering technique that efficiently combines a non-correlated noise signal (also referred to as dither) with the desired signal to achieve high performance A/D conversion. The techniques can be employed in other noise-based applications as well. In addition, a self-contained dithering module is disclosed that generates a desired amplitude of noise as well as the appropriate noise signal roll-off for optimal dithering results.

In accordance with the principles of the present invention, injected noise and the desired signal are not co-spectral, and the desired signal has minimal loss caused by the circuit which adds the noise to it. In addition, the amount of noise power needed from the noise source to achieve the desired dithering effect is significantly reduced relative to conventional dithering techniques, which typically employ a directional coupler. In contrast, the present invention employs a diplexer to combine the dither with a desired signal. The diplexer offers low loss to the noise path as well as the signal path eliminating the need for extra gain.

As previously stated, dithering effectively normalizes of all the DNL errors associated with a data converter by spreading coherent signal spurs into the noise floor of the converter. In this sense, the spurs are converted into non-coherent noise. Because the noise floor increases as the signal spurs are spread into it, the overall RMS error remains unchanged. As the DNL errors approach zero due to this spreading, their contribution to the signal-to-noise ratio (SNR) and the SFDR are removed, and performance is maximized.

Dithering Module

Figure 1:
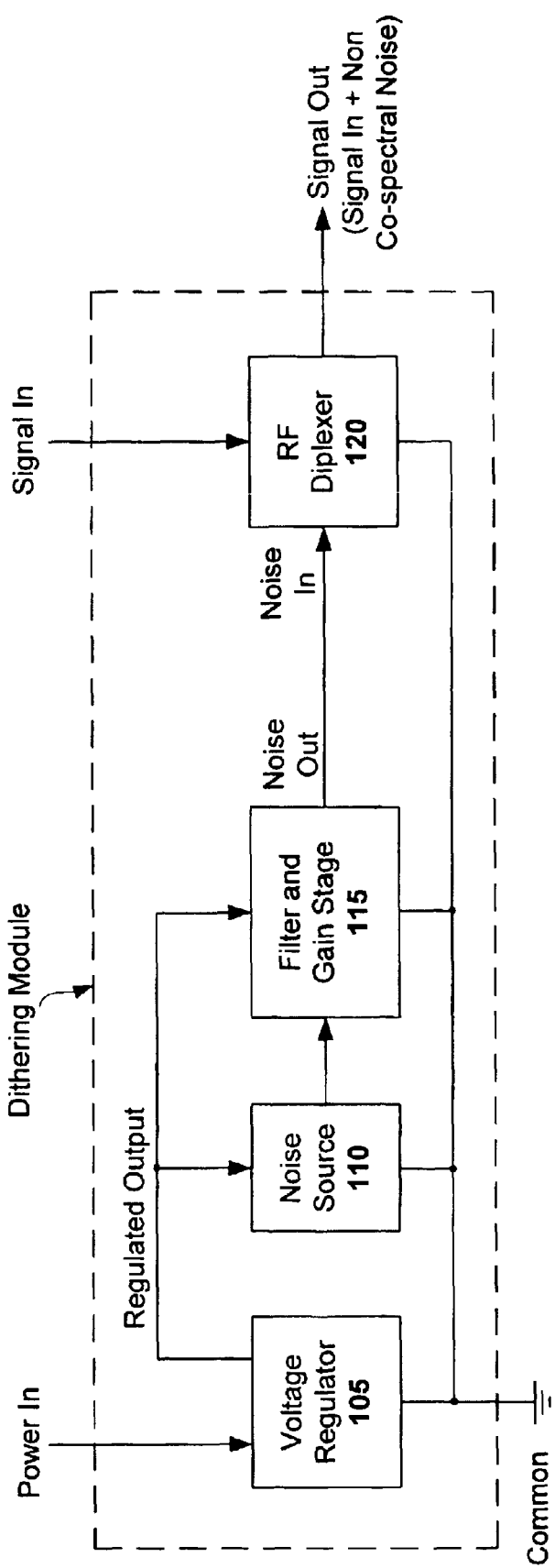
FIG. 1 is a block diagram of a self-contained dithering module configured in accordance with one embodiment of the present invention.

FIG. 1 is a block diagram of a self-contained dithering module configured in accordance with one embodiment of the present invention. The device includes a voltage regulator 105, a noise source 110, a filter and gain stage 115, and an RF diplexer 120. Power is supplied to the regulator 105, which in turn provides regulated power internal to the device. A desired input signal is provided to the diplexer 120, along with a non-correlated noise signal from the filter and gain stage 115. The signal output by the device includes both the desired signal and the noise. This output can be provided to, for example, a data converter or other device that can benefit from the effect of injecting non-correlated noise.

The voltage regulator 105 receives power from a source, such as a battery or external supply, and provides a regulated output power. This regulated output is made available to other active modules of the device. The regulator 105 can be implemented in conventional technology, and may further be configured with a step up or down transformer to adjust the input voltage. In one particular embodiment, the regulator 105 receives an input voltage of about +15 volts DC referenced to the common (ground), and provides a regulated 10 volt DC output. Numerous voltage output values and regulator configurations will be apparent in light of this disclosure (e.g., such as a dual output source, having both +5 and +15 volts DC regulated outputs generated from a signal input source.

The noise source 110, which can be implemented in conventional technology, receives power from the regulator, and generates the dither. Dither is essentially Gaussian noise (noise characterized by a normal probability distribution function). This noise source 110 can be implemented, for example, with a large value resistor where the noise from the resistor (in RMS) would be equal to the square root of (4kTRΔf). Here, k is Boltzmann's constant ($1.38 \times 10^{-23}$ J/° K), T is the resistor temperature (Kelvin), R is the value of the resistor (ohms), and Δf is the bandwidth of frequencies which the subsequent gain stage 120 is able to amplify.

Alternatively, the noise source 110 can be implemented with a noise diode. A number of such diodes are available, such as the SD20L produced by Micronetics, in Hudson, N.H. Numerous other noise sources can be used to implement source 110, and the present invention is not intended to be limited to any one such source. The frequency range, output power, flatness, biasing, and other related parameters will vary depending upon the particular application. Alternatively, general solid state noise sources may also be used here.

The gain and filter stage 115 operates to shape the noise produced by source 110 and to amplify the noise output of source 110 to an acceptable level. The amplification is provided because the noise power levels produced by source 110 are typically small (e.g., 20 to 50 ENRdB). The shaping includes low-pass filtering the generated noise signal to ensure that it does not encroach on the frequency band of the desired signal. The filtering can be passive or active (with or without gain) depending on the particular application. For example, some applications may require a steeper roll-off and/or more gain than other applications.

In one particular embodiment, the gain and filter stage 115 is implemented as a passive single pole, low pass filter in series with a differential amplifier having sufficient gain to produce a noise out signal with the desired amplitude. Additional poles and or gain can be provided as necessary. Optional circuit driving capability (e.g., for current-based applications such as A/D conversion) may also be included in the gain and filter stage 115. Alternatively, such optional driving capability may be external to the gain and filter stage 115.

In another particular embodiment, the gain and filter stage 115 has a number of sections including a differential amplifier that amplifies the output of the noise source 110 (e.g., gain of 2 or more), and provides a differential output to an active low-pass filter. The active low-pass filter can have, for example, a pass-band gain (e.g., 5 dB or more), a corner frequency under 5 MHz, and a roll-off of 20 dB/decade or better. The output of the low-pass filter section can then be applied to another amplifier capable of low voltage processing, as well as driving the likes of an A/D converter or other noise-based applications.

Note that numerous gain and filter stage 115 configurations are possible here, and the principles of the present invention can be employed with any one of them. Design choices and implementation details such as what specific components to use and whether to use active or passive filtering (or some combination thereof), as well as selecting the appropriate parameters such as overall gain and filter-order, must be made on an application-by-application basis. Further note that intermediate sections of the gain and filter stage can be repeated or otherwise configured as necessary to shape the noise output accordingly.

Another particular design choice that can be integrated into an embodiment of the present invention is whether the device requires a variable dither level. Such a feature may be necessary, for instance, to account for changes in system loading over time. If so, then noise gain control can be provided. For example, programmable switches or programmable resistors can be used to adjust the gain impedances of the amplifier stage 115. The corresponding control signals can be provided via a processor, such as a microcontroller configured with a CPU, I/O capability, and a number of executable processes, including gain monitoring and adjusting routines. Any local host or other suitable controlling-type environment can be employed here to carry out such control signaling. In the case where variable dither is unnecessary, fixed gain blocks or even low cost operational amplifiers can be used here, particularly if only several hundred kilohertz of noise bandwidth are actually used.

Regardless of the actual gain and filter stage 115 configuration, the amplified and filtered noise output is provided to the diplexer 120, which is adapted to combine the noise signal with the desired signal. A diplexer is a filtering network by which two frequency bands can be combined provided the two bands are not co-spectral. In this particular embodiment, the noise signal frequency band is lower than the desired signal frequency band. The diplexer 120 provides low insertion loss (e.g., less than 3 dB) to the noise path as well as the signal path eliminating the need for extra gain. In addition, the diplexer 120 provides low-pass filtering which can be used to supplement or otherwise replace the low-pass filtering performed by the filter and gain stage 115.

Diplexer 120 can be implemented in conventional technology, and typically includes a high-pass filter in parallel with a low-pass filter. A number of RC series tank elements in parallel with the filters compensates for undesired reflections. The diplexer may be implemented, for example, from lumped or continuous passive elements. Active diplexer configurations are available as well. Triplexers are three way splitter/combiners which include a low pass, band pass, and high-pass sections. A triplexer operates similar to a diplexer, but allows for a tri-band operation. An application for such would be, for example, where two noise signals are injected into a desired signal. One noise signal band would be below the desired signal, while the other noise signal band would be above the desired signal band (assuming there would be no interference of the desired signal's frequency band).

Note that the diplexer parameters can be selected or otherwise set to accommodate the particular application. For instance, the low-pass filtering parameters (e.g., corner frequency, roll-off, order, insertion loss, and active/passive) can be set based on the band of the analog signal and the sampling technique being used in an A/D converter application.

In more detail, techniques of over-sampling and under-sampling are frequently employed in A/D applications to maximize data rate and/or minimize bit error rate. The result is that the desired signal may occupy a greater bandwidth than it might otherwise occupy. The added noise must therefore not encroach on this loaded bandwidth. In this manner, the low-pass filtering in the diplexer 120 can be adjusted for a sharper low-pass roll-off of the noise. Similarly, the low-pass portion of the diplexer can also work in conjunction with gain/bandwidth low pass filtering of the filter and gain stage 115 for sharper roll-off.

Thus, a self-contained dithering module which has a desired signal input and a signal plus non co-spectral noise output, a DC power source and ground, is disclosed. This module can be configured to generate the desired amplitude of noise for a particular usage or application, as well as the appropriate noise signal roll-off for optimal down-stream results, whether the down-stream process involves data conversion or some other noise-based application.

Variations on the embodiment shown in FIG. 1 will be apparent in light of this disclosure. For example, note that voltage regulator 105 is not required, as the power source (e.g., battery or other power supply) may be connected directly to the components of the dithering module. Further note that the filtering included in the filter and gain stage 115 can be eliminated, so long at the filtering in the diplexer 120 operates to prevent the injected dither from interfering with the desired signal. Further note that low-pass and/or high-pass filtering can be included in the filter and gain stage 115, depending on whether the frequency band of injected noise is above or below or both the frequency band of the desired signal.

Figure 2:
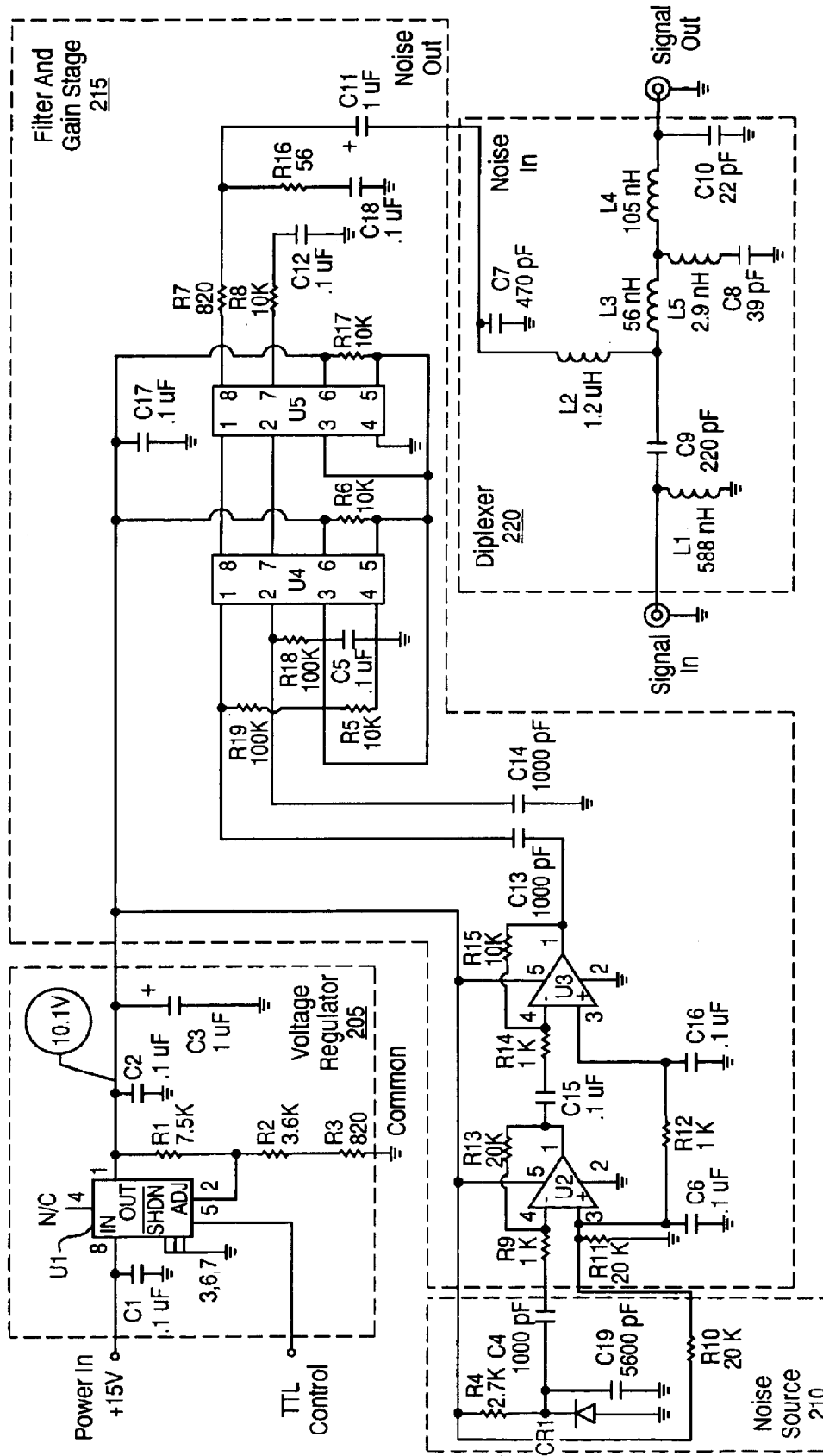
FIG. 2 is a detailed schematic diagram of a self-contained dithering module configured in accordance with one embodiment of the present invention.

FIG. 2 is a detailed schematic diagram of a self-contained dithering module configured in accordance with one embodiment of the present invention. This Figure is included to show a specific embodiment of the present invention in the name of robust disclosure, and is not intended to limit the present invention to any one specific configuration or component types. It will be appreciated that numerous configurations and component types are possible. The individual selections of component type and manufacturer will depend on a number of factors including desired cost, various parameter ratings, overall desired device performance given a particular application, and other related considerations.

As can be seen, this embodiment includes a voltage regulator 205, a noise source 210, a filter and gain stage 215, and an RF diplexer 220. Power (+15 volts DC) is supplied to the regulator 205, which in turn provides regulated power internal to the device. A desired input signal is provided to the diplexer 220, along with a non-correlated noise signal from the filter and gain stage 215. The signal output by the device includes both the desired signal and the noise. As previously stated, this output can be provided to a noise-based application, such as a data converter.

The voltage regulator 205 provides approximately a 10 volt DC regulated output to each of the noise source 210 and the filter and gain stage 215. This particular regulator 205 provides a TTL control feature which allows the regulated output to be shut on and off. The noise source 210 here is implemented with a noise diode (CR1) that is capable of generating an output signal of 35 ENRdB (or better) over the frequency range of 10 to 100 MHz, with a flatness of 5 dB or less (e.g., SD20LEE-3, Micronetics). Note that the DC biasing may be adjusted to adjust the noise output. Further note that a TTL driver can be included to enable control of the on/off biasing (provided by regulator 205) of the noise source 210. This allows the noise source 210 to be controlled with a TTL command rather than having to switch the regulator 205 on and off. The TTL command signal can be provided to 205, for example, by a local host or processor.

This particular gain and filter stage 115 includes a gain block including two wideband operational amplifiers (U2 and U3) which amplify the output of the noise source 210. Numerous amplification schemes are possible here. The amplified output is provided to an active low-pass filter block (U4 and U5). In one such embodiment, the active low-pass filters are each a $7^{th}$ order filter having a pass-band gain of about 12 dB, and a corner frequency of about 2.3 MHz (e.g., LTC1566-1, Linear Technology). These cascaded filters effectively double gain and roll-off performance. The output of the low-pass filter block is applied to the noise input of the diplexer 220.

Note that, although off-the-shelf components have been used to implement the voltage regulator 205, noise source 210, filter and gain stage 215, and RF diplexer 220 in this particular example shown in FIG. 2, other embodiments may employ custom integrated circuits (e.g., ASIC and FPGA technology) to provide the function of each illustrated component. Such a custom design can be implemented in a single integrated circuit chip or a number of function-specific chips that are operatively coupled. The overall dithering circuit can then be incorporated into an appropriate package adapted with SMA fittings or other suitable interfacing mechanisms (e.g., BNC connectors, solder pads or loops, wire-bonding pads).

Operating parameters of a dithering module configured in accordance with the present invention can be expressed as specs on the desired signal or "carrier" path as well as on the combined signal+noise output or "noise" path. Example operating parameters of the carrier path include a pass band of about 60 to 80 MHz, an insertion loss of 1 dB or less, an impedance of about 50 ohms, a VSWR of 1:4:1 or better, an LO rejection of 60 dB or better, and a high end roll-off of about 60 dBc or more. Example operating parameters of the noise path include a pass band of about 1 kHz to 3 MHz, a noise flatness of 2 dB or less, a noise power of about −20 to −17 dB, an out-of-band noise output of about −145 dBm/Hz @20 MHz and −174 dBm/Hz @30 MHz. It will be appreciated that such operating parameters and packaging details will vary from embodiment to embodiment, and the present invention is not to be limited to any particular parameter set or packaging scheme.

Methodology

Figure 3:
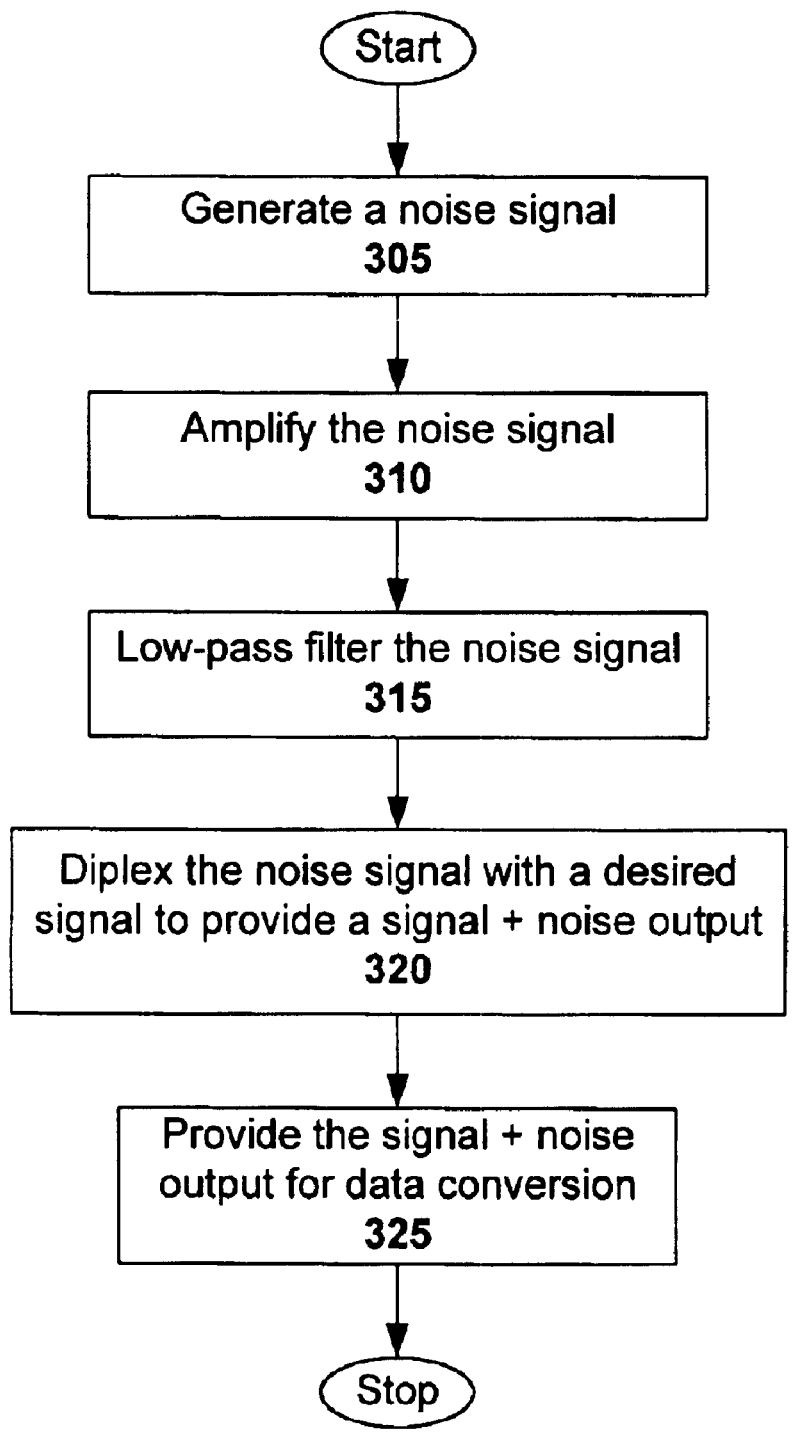
FIG. 3 illustrates a method for generating a dithered signal in accordance with one embodiment of the present invention.

FIG. 3 illustrates a method for generating a dithered signal in accordance with one embodiment of the present invention. This method can be carried out, for example, by the dithering modules illustrated in FIGS. 1 and 2. The method includes with generating 305 a noise signal (e.g., Gaussian white thermal noise), and amplifying 310 the noise signal.

The method further includes filtering 315 the noise signal, so as to prevent the noise from adversely affecting the desired signal band. In one particular embodiment, low-pass filtering is performed. However, other types of filtering (e.g., high-pass or band-pass) may also be used here, depending on the location of the noise band or bands relative to the band of the desired signal.

The method proceeds with diplexing 320 the noise signal with a desired signal to provide a signal+noise output. A conventional or custom diplexer can be used to effect this functionality. In alternative embodiments, a triplexer can be used, where the method would include triplexing first and second noise signals with a desired signal to provide a signal+noise$_1$+noise$_2$ output. In a more general sense, the method includes combining 320 the noise signal with the desired signal to provide a signal+noise output, wherein both the desired signal and the noise signal experience low (or otherwise acceptable) insertion loss (e.g., 3 dB or less).

The insertion loss associated with a device generally refers to the loss of unrecoverable power dissipated within that device. In this sense, insertion loss can be thought of as having both unintentional and intentional components. The unintentional component is that attributed to parasitics, while the intentional component is more so attributed to design choices (e.g., such as using a 20 dB pad between ports of a directional coupler). A diplexer (or equivalents thereof) effectively avoids this intentional component of the insertion loss. Directional couplers on the other hand, typically employ 10 dB or more of intentional attenuation to isolate one port from another. By avoiding the intentional insertion loss, the overall insertion loss can be maintained at acceptable levels (e.g., 3 dB or less). Also, note other benefits here, such as lower power consumption and heat generation.

The method may further proceed with providing 325 the signal+noise output to a noise-based application, such as a data conversion process.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method for diplexer-based dithering a desired signal having a frequency band, the method comprising:
   generating a noise signal;
   amplifying the noise signal;
   filtering the amplified noise signal, so as to prevent that noise signal from adversely affecting the frequency band of the desired signal; and
   diplexing with a diplexer the filtered noise signal with the desired signal to produce a signal+noise signal.

2. The method of claim 1 further comprising:
   providing the signal+noise signal to a noise-based application.

3. The method of claim 2 wherein the noise-based application is a data conversion process.

4. The method of claim 1 wherein the noise signal is thermal noise.

5. The method of claim 1 wherein filtering the amplified noise signal includes low-pass filtering that noise signal.

6. The method of claim 1 wherein the diplexing provides insertion loss associated with the desired signal and the noise signal of 1 dB or less.

7. The method of claim 1 wherein the diplexing is performed with a passive diplexer.

8. A method for dithering a desired signal having a frequency band, the method comprising:
  generating a noise signal;
  amplifying the noise signal; and
  passively combining the amplified noise signal with the desired signal to produce a signal+noise signal, wherein both the desired signal and the noise signal experience insertion loss of 3 dB or less.

9. The method of claim 8 wherein amplifying the noise signal further includes:
  filtering the noise signal, so as to prevent the noise signal from adversely affecting the frequency band of the desired signal.

10. The method of claim 9 wherein filtering the noise signal includes low-pass filtering that noise signal.

11. The method of claim 8 wherein passively combining the amplified noise signal with the desired signal further includes combining a second noise signal, and the desired signal+noise signal includes the second noise signal.

12. The method of claim 8 further comprising:
  providing the signal+noise signal to a noise-based application.

13. The method of claim 12 wherein the noise-based application is a data conversion process.

14. The method of claim 8 wherein the noise signal is thermal noise.

15. The method of claim 8 wherein the insertion loss experienced by the noise signal is less than 1 dB.

16. A self-contained dithering device comprising:
  a noise source adapted to generate a noise signal;
  an amplification stage adapted to amplify the noise signal; and
  a diplexer adapted to diplex the filtered noise signal with a desired signal to produce a signal+noise signal.

17. The device of claim 16 wherein the amplification stage is further adapted to filter the noise signal, so as to prevent that noise signal from adversely affecting the frequency band of the desired signal.

18. The device of claim 16 wherein the amplification stage further includes one or more active low-pass filters adapted to filter the noise signal.

19. The device of claim 16 wherein the noise signal is thermal noise.

20. The device of claim 16 wherein the diplexer provides an insertion loss associated with the noise signal that is 1 dB or less.

21. The device of claim 16 wherein the device is contained in a package having a power input, a desired signal input, a signal+noise output, and a common.

22. The device of claim 16 wherein the diplexer is a passive diplexer.

23. A method for diplexer-based dithering a desired signal having a frequency band, the method comprising:
  diplexing with a diplexer a noise signal with a desired signal to produce a signal+noise signal for use in a data conversion process performed by an analog-to-digital converter.

24. The method of claim 23 wherein the diplexing is performed with a passive diplexer.

25. The method of claim 23 wherein insertion loss experienced by the noise signal is 1 dB or less.

* * * * *